United States Patent [19]
Pugh

[11] B 3,990,061
[45] Nov. 2, 1976

[54] GAPLESS PROPAGATION STRUCTURES FOR MAGNETIC BUBBLE DOMAINS

[75] Inventor: Emerson W. Pugh, Mount Kisco, N.Y.

[73] Assignee: International Business Machines Corporation, Armonk, N.Y.

[22] Filed: Dec. 27, 1973

[21] Appl. No.: 429,018

[44] Published under the second Trial Voluntary Protest Program on February 10, 1976 as document No. B 429,018.

[52] U.S. Cl. .................... 340/174 TF; 340/174 SR
[51] Int. Cl.² .................. G11C 11/14; G11C 19/08
[58] Field of Search ................ 340/174 TF, 174 SR

[56] References Cited
UNITED STATES PATENTS

| | | |
|---|---|---|
| 3,516,077 | 6/1970 | Bobeck et al. ............... 340/174 TF |
| 3,518,643 | 6/1970 | Perneski ........................ 340/174 TF |
| 3,534,346 | 10/1970 | Bobeck ......................... 340/174 TF |
| 3,534,347 | 10/1970 | Bobeck ......................... 340/174 TF |
| 3,644,908 | 2/1972 | Bobeck ......................... 340/174 TF |
| 3,689,901 | 9/1972 | Bobeck ......................... 340/174 TF |
| 3,778,788 | 12/1973 | Bobeck et al. ............... 340/174 TF |
| 3,815,107 | 6/1974 | Almasi ........................... 340/174 TF |
| 3,828,329 | 8/1974 | Fischer et al. ............... 340/174 TF |

*Primary Examiner*—Stanley M. Urynowicz, Jr.
*Attorney, Agent, or Firm*—Sughrue, Rothwell, Mion, Zinn & Macpeak

[57] ABSTRACT

Gapless, single-sided propagation structures are provided for implementing the continuous movement of magnetic bubble domains in both straight lines and around reverse direction turns under the control of a reorienting in-plane field. One embodiment comprises a closed loop of open-sided, joined hexagonal patterns having traps and dead end legs at the joined corners to cause transfer from one hexagonal pattern to the next, thus implementing continuous circulation around the loop and preventing backtracking. Another embodiment employs straight, parallel strips joined at their ends to form a loop. Bubble movement is promoted by a series of angled strip legs intersecting the main strips to provide sequentially advancing magnetic poles as the field vector rotates.

8 Claims, 4 Drawing Figures

U.S. Patent  Nov. 2, 1976  3,990,061
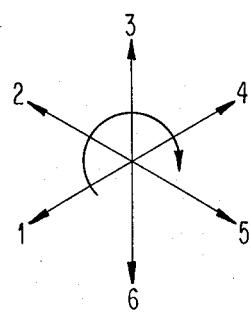
FIG. 1A
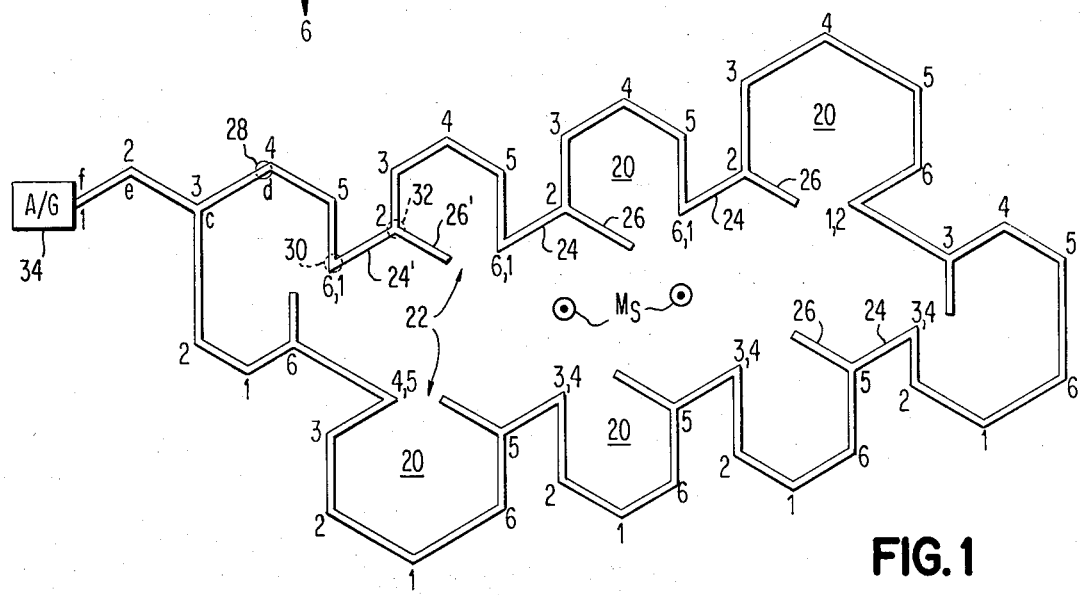
FIG. 1
FIG. 2A
FIG. 2

GAPLESS PROPAGATION STRUCTURES FOR MAGNETIC BUBBLE DOMAINS

BACKGROUND OF THE INVENTION

1. Field of the Invention

This invention relates to magnetic bubble domains, and more particularly to gapless propagation structures for implementing the controlled movement of magnetic bubble domains in a supporting medium.

2. Description of the Prior Art

In the new and rapidly developing field of technology relating to magnetic bubble domains the preferred means for implementing the controlled movement of bubbles within a magnetic medium, such as a platelet of orthoferrite or garnet material, has involved the use of overlay strips of permalloy or the like. These strips are magnetically soft, are laid down on top of the platelet, and serve to channel and concentrate the flux from a rotating in-plane magnetic field. This concentration produces poles at the ends of the strips when they are aligned with the rotating field, and these poles attract (or repel) the bubbles to thereby control their movement.

The permalloy structures currently in use include the T-I bar, Y-I bar, Y-Y bar and chevron patterns, and rely on gaps between the bars to provide a continuous flow of bubbles around the structures in the presence of a rotating or pulse-sequenced magnetic field.

These gapped permalloy patterns are characterized by a number of major disadvantages. For one, the bubble diameter must be substantially larger (typically 2 times larger) than the gap width in order to traverse it. This reduces the density of storage which can be achieved for a given line width because unwanted magnetic interactions between bubbles require that bubbles be separated by distances greater than $kD$, where D is the bubble diameter and $k$ is a device sensitive parameter, typically about 4. In addition, a bubble must be elevated to a higher energy state to traverse a gap, which renders it momentarily less stable and thus more likely to collapse, split, or otherwise behave in an erratic manner, thus reducing device operating margins. Finally, the close dimensional tolerances that must be maintained at the gaps makes the fabrication of the permalloy overlays more difficult and increases the likelihood of serious propagation errors occurring at the gaps.

Several propagation structures which are generally of a gapless form have been proposed in the prior art, as typified by U.S. Pat. Nos. 3,516,077 (tangent discs on alternately opposite sides of a platelet), U.S. Pat. No. 3,518,643 (zig-zag strip), and U.S. Pat. No. 3,644,908 (sinuous strip alongside a straight strip). All of these structures have a number of disadvantages, however, such as low packing density and the ability to implement bubble movement in only a single direction.

It is therefore an object of the present invention to provide singlesided, gapless propagation structures for implementing the controlled movement of magnetic bubble domains in a supporting medium.

It is a further object of the invention to provide such structures of the closed loop type wherein bubbles may be propagated in any direction for any given drive field sequence, including the simultaneous propagation of a plurality of bubbles in different and even opposite directions in response to the same drive field.

SUMMARY OF THE INVENTION

This invention obviates the above-noted disadvantages attendant with the prior art by providing gapless, single-sided propagation structures of permalloy or the like which enable the continuous movement of magnetic bubbles along both straight line and curved paths, and along generally parallel straight line paths in opposite directions, in response to an in-plane rotating or pulse-sequenced magnetic field.

In a first embodiment of the invention the permalloy pattern is generally in the form of joined, open-sided polygons having bubble traps at the joint areas to promote continuous movement in a preferred direction. In a second embodiment the bubble movement paths are defined by straight line strips of permalloy provided with angled, intersecting strip legs which produce advancing magnetic poles in the straight line strips as the propagation field rotates.

The teachings of this invention are equally applicable to propagation structures incorporated directly within a supporting medium, such as by ion implantation, and are not limited to permalloy strips or the like.

BRIEF DESCRIPTION OF THE DRAWINGS

In the drawings:

FIG. 1 shows a top view of a gapless propagation structure in accordance with a first embodiment of the invention in the form of a continuous permalloy strip laid down in a joined, open-sided polygon pattern, FIG. 1A shows a rotating magnetic field vector for propagating magnetic bubble domains in the pattern of FIG. 1, FIG. 2 shows a top view of a gapless propagation structure in accordance with a second embodiment of the invention in the form of a reversed straight line pattern having pole defining, intersecting legs, and FIG. 2A shows a rotating magnetic field vector for propagating magnetic bubble domains in the pattern of FIG. 2.

DESCRIPTION OF THE PREFERRED EMBODIMENTS

Referring to the drawings, FIG. 1 shows a strip of permalloy or other magnetically soft material laid down in a joined, open-sided polygon configuration in a closed loop manner. For purposes of description and understanding, it will be assumed that the plane of the drawing paper represents the upper surface of a platelet of material of orthoferrite, garnet or the like and that a magnetic field of sufficient magnitude to support bubble domains extends up through the platelet and normal thereto, as indicated by arrowheads $M_s$. The permalloy strip may be bonded directly to the surface of the platelet, or may be slightly spaced therefrom by an insulating layer.

The polygons in this embodiment are shown as generally hexagonal figures 20 each having an open or missing side 22. The hexagons are joined to form a continuous path by connecting legs 24, and each one has a dead end leg 26 intersecting at an angle of approximately 120° with a connecting leg. For convenience, numerals 1–6 have been placed at the various side intersections or corners of the hexagons to indicate the presence of a positive pole when the propagation field vector of FIG. 1A is at a similarly numbered rotational phase position.

Consider now that the propagation field or H vector is at phase 4 and a magnetic bubble domain 28 exists at corner 4 in the upper left hand hexagon. As the field vector rotates through phase 5 to phase 6 the bubble will "follow the poles" in the usual manner and move in a clockwise direction through corner 5 to corner 6, 1, as indicated by chain line at 30. As the field vector continues on to phase 1 the bubble will not appreciably move since the connecting leg 24' maintains a positive pole at the 6, 1 position. When the field vector reaches phase 2 a positive pole is established at the Y intersection of the dead end leg 26', and the bubble will thus be drawn over to the 2 position as shown by chain line 32. The bubble has thus moved from one hexagon 20 to the next one in the path, with the "trap" defined by the approximately 60° intersection at the 6, 1 position between the connecting leg 24' and the 5–6 leg preventing the bubble from moving in the opposite direction and retracing its path.

As the field vector continues to rotate through phases 3, 4, etc., the bubble moves around the new or second hexagon. A similar analysis will quickly reveal that as the field vector rotates the bubble will traverse the entire closed loop, and after nine full rotations of the field vector it will end up back where it began.

It is significant to note that with this configuration the same direction of rotation of the field vector moves the bubble to the right in the upper row of hexagons and to the left in the lower row, as well as both down and up at the ends of the rows to complete the loop. It should be apparent that the generally horizontal loop configuration shown in FIG. 1 is illustrative only, and many other configurations are equally available. In most practical applications, a great many more hexagonal stages would be provided and a number of bubbles would circulate simultaneously in the manner of a shift register.

A simple analysis will also reveal that the direction of bubble circulation within the overall loop can be reversed by rotating the field vector in the opposite or counterclockwise direction.

A bubble can easily be added to or removed from the loop using the structure shown in the upper left hand corner of FIG. 1 by momentarily reversing the field vector rotation for a few phases. If a bubble is at the c position, for example, with the field vector at phase 3, the reversal of the field vector back through phases 2 and 1 will move the bubble through the e position to the f position. An annihilator/generator 34 may be provided at this point to implement bubble destruction or generation. If the field vector is again reversed to its normal clockwise rotation through phases 1, 2, 3, 4, etc., a bubble generated at 34 will travel through the f, e, c, d positions and thus enter the loop. This momentary reversal of the field vector has no effect on the other bubbles in the loop, which merely backtrack two steps while maintaining their same positions relative to each other.

In the embodiment shown in FIG. 2 the bubble propagation path follows a generally straight line as defined by the upper and lower parallel, continuous permalloy strips 36 and 38, respectively. These strips are joined at their ends to form a closed loop, with only one end of the loop being shown for the sake of simplicity. The movement of a magnetic bubble domain in a platelet underlying the strips in response to the rotating field vector shown in FIG. 2A is implemented by an advancing magnetic pole established at the intersections of the main strips 36, 38 with the angled legs 40, 42, 44, 46, 48, etc. The angle of intersection of legs 40 and 46 with strip 38 is approximately 90°, while for legs 42, 44 and 48 the absolute angle is approximately 45°. As with FIG. 1, numerals 1–8 have been placed at the various intersections to indicate the presence of a positive pole when the propagation field vector of FIG. 2A is at a similarly numbered rotational phase position.

Considering the field vector to be in phase 1 a positive pole is established in lower strip 38 where it intersects with leg 40, and thus a bubble 50 may be held at this position as shown. As the field vector rotates counterclockwise to phase 2 a positive pole is established in strip 38 where it intersects with leg 42, and the bubble moves over to this 2 position. When the field vector is in phase 3 the pole strength at the 2 position in strip 38 becomes somewhat diminished but a positive pole of equal strength is established at the 4 position where leg 44 intersects with strip 38, and the combined effect of these closely spaced poles serves to hold the bubble in the vicinity of the 3 position midway between the poles. As the field vector continues to rotate through phases 4, 5, 6, 7 and 8 the bubble follows the moving poles sequentially established at the 4, 5, 6, 7 and 8 positions in strip 38, and thereafter makes the turn into the upper strip 36 and continues its counterclockwise circulations.

As with the embodiment of FIG. 1, the same rotating propagation field can cause the simultaneous movement of bubbles in opposite directions in the main strips of the loop, i.e., to the right in strip 38 and to the left in strip 36. Stated another way, the counterclockwise rotating field vector of FIG. 2A causes the counterclockwise circulation of all bubbles within the loop, regardless of their positions. The reversal of the field vector of FIG. 2A to a clockwise direction of rotation merely reverses the direction of bubble circulation.

The practical utilization of the propagation structures disclosed herein could be accomplished in the usual manner, i.e. with the presence of a bubble representing a logical "one" and the absence of a bubble representing a logical "zero". Sensing could be implemented by magnetoresistive or other well known elements. The loops shown could, for example, be employed as minor recirculating loops in a mass-memory with control lines provided to generate field gradients of sufficient strength to pull selected bubbles from the minor loops to an interconnecting major loop, and vice versa. Alternatively, loop transfer could also be accomplished by momentary field reversal using the branch strips shown in the upper left hand corner of FIG. 1.

What is claimed is:

1. A gapless, single-sided propagation structure for implementing the continuous, generally unidirectional movement of magnetic bubble domains in a supporting material in response to an externally applied, in-plane magnetic field rotating in a constant circular direction through a plurality of phases, comprising:

a generally undulating, non-self-crossing strip of magnetic material having in-plane magnetization, trapping means associated with each undulation at a discrete predetermined position thereon for momentarily holding a bubble substantially stationary at said position during at least two sequential phases of said magnetic field rotation as the magentic field continues to rotate, and pole establishing means adjacent each trapping means for establishing a discrete magnetic pole for attracting a bubble from said position to thereby cause its continued, generally unidirectional movement into the next undulation, wherein the magnetic bubble domains are propagated along the path defined by the undulating strip of magnetic material, and wherein the pole establishing means intersects said path but does not comprise a substantial portion thereof along which the bubble domains propagate in normal operation.

2. A gapless propagation structure as defined in claim 1 wherein each trapping means is adjacent the end of an undulation, taken in the direction of bubble movement, and each pole establishing means is adjacent the beginning of the next undulation taken in the same direction.

3. A gapless propagation structure as defined in claim 2 wherein the undulating strip forms a closed loop.

4. A gapless propagation structure as defined in claim 1 wherein the undulating strip forms a closed loop.

5. A gapless propagation structure as defined in claim 1 wherein the undulations are defined by open-sided polygons, each of the trapping means includes a connecting strip of magnetic material extending between adjacent polygons, and each of the pole establishing means comprises a dead end side of a polygon.

6. A gapless propagation structure as defined in claim 5 wherein the polygons are hexagons.

7. A gapless, single-sided propagation structure for implementing the continuous movement of magnetic bubble domains in a supporting material in response to a rotationally reorienting in-plane magnetic field comprising:

at least two substantially straight strips of magnetic material having in-plane magnetization, and a plurality of passive means associated with said strips at spaced locations thereon for automatically establishing sequentially advancing magnetic poles at said locations in response to said rotationally reorienting magnetic field, each passive pole establishing means comprising a strip of magnetic material connected at one end to a straight strip, the plurality of said strips intersecting the straight strips at a plurality of different angles, and strips of magnetic material joining the two straight strips at their ends to form a closed loop.

8. A gapless, single-sided propagation structure for implementing the continuous movement of magnetic bubble domains in a supporting material in response to a rotationally reorienting in-plane magnetic field comprising:

at least one substantially straight strip of magnetic material having in-plane magnetization, and a plurality of passive means associated with said strip at spaced locations thereon for automatically establishing sequentially advancing magnetic poles at said locations in response to said rotationally reorienting magnetic field, each passive pole establishing means comprising a strip of magnetic material connected at one end to the straight strip, the plurality of said strips intersecting the straight strip at a plurality of different angles, the plurality of said strips being arranged in groups with alternate groups being disposed on opposite sides of the straight strip, and the strips of one group fanning out from the straight strip and the strips of the next groups fanning in from the straight strip.

* * * * *